METHOD OF MAKING SEMICONDUCTOR DEVICES HAVING THIN ACTIVE REGIONS OF THE SEMICONDUCTOR MATERIAL
Filed May 2, 1973

3,846,198

METHOD OF MAKING SEMICONDUCTOR DEVICES HAVING THIN ACTIVE REGIONS OF THE SEMICONDUCTOR MATERIAL

Cheng Paul Wen and Yuen-Sheng Chiang, Trenton, N.J., assignors to RCA Corporation, New York, N.Y.

Continuation-in-part of abandoned application Ser. No. 293,804, Oct. 2, 1972. This application May 2, 1973, Ser. No. 356,322
Int. Cl. H01l 7/50
U.S. Cl. 156—17 9 Claims

ABSTRACT OF THE DISCLOSURE

Semiconductor devices of the type having a thin active region of the semiconductor material on a support body are made by depositing the active region on a silicon substrate with a thin barrier layer of highly doped P type silicon being provided between the active region and the substrate. The support body is applied to the active region and the substrate is removed by etching in a solution of potassium hydroxide and 1-propanol. The etching solution removes the substrate but stops at the barrier layer leaving a smooth, flat surface. The barrier layer can be either used as part of the semiconductor device being made or easily removed with a suitable etchant.

BACKGROUND OF THE INVENTION

This is a continuation-in-part of our patent application Ser. No. 293,804, filed Oct. 2, 1972, now abandoned, entitled "Method of Making Semiconductor Devices Having Thin Active Regions of the Semiconductor Material."

The present invention relates to a method of making semiconductor devices having thin active regions of the semiconductor material. More particularly, the present invention relates to a method of selectively etching away a semiconductor substrate to leave a thin region of semiconductor material on a support.

High frequency semiconductor devices and integrated circuits require high quality, ultra-thin, uniformly thick bodies of a semiconductor material on a metallic or electrically insulating support. A problem in making such devices is to achieve the ultra-thin, less than about 10 microns, bodies of the semiconductor material. To handle a large wafer of the semiconductor material which is this thin is very difficult since such a thin wafer is very brittle and subject to be easily broken. To overcome this problem, it has been the practice to use a relatively thick wafer, in the order of .075 mm. in thickness, which can be more easily handled. The thick wafer is mounted on a support and is then thinned down to the desired thickness either by mechanical or chemical polishing techniques.

Thinning the wafer by mechanical polishing has the disadvantage that as the wafer becomes thinner it becomes more subject to being broken under the application of the mechanical polishing process. Also, the mechanical polishing processes have a tendency to create defects in the surface of the wafer which can adversely affect the electrical characteristics of the device being formed. Thinning the wafer by heretofore known chemical polishing processes has the disadvantage that such chemical polishing processes have a tendency to provide the wafer with a curved surface rather than a flat surface, particularly when the wafer must be thinned a large amount. Thus, the thinned wafer would be of non-uniform thickness so that the individual devices made from the wafer would be of non-uniform thickness.

Another process which has been developed to achieve a thin body of a semiconductor material on a support is an electrolytic etching process. For this process a barrier layer of a high resistance semiconductor material is applied to the surface of a substrate of a low resistance semiconductor material, the thin body of the semiconductor material is applied to the barrier layer and the support is applied to the body. The substrate is then removed by electrolytically etching away the substrate. The etching of the substrate will stop when the barrier layer is reached so as to leave the thin body on the support. However, this process also has certain disadvantages. To achieve the electrolytic etching, the device must be connected in a suitable electric circuit. To so etch a plurality of the devices at one time for mass production requires a separate circuit for each device so that the apparatus becomes cumbersome. Also, to ensure that all of the substrate is etched away, it is necessary to either properly position the device at an angle in the electrolytic etching solution and/or repeatedly dip the device deeper and deeper in the solution. Thus, special handling of the device is required during the etching operation which makes mass production more difficult.

SUMMARY OF THE INVENTION

A semiconductor device is made by forming on a surface of a substrate of single crystalline silicon a thin barrier layer of single crystalline, P type conductivity silicon with the free carrier concentration being greater than $5\times10^{19}$ cm.$^{-3}$. On the silicon layer is formed a region of single crystalline silicon which is of a conductivity type or types required by the semiconductor device being formed, and the substrate is removed by etching with a solution of potassium hydroxide and 1-propanol.

DETAILED DESCRIPTION

Figure 2:
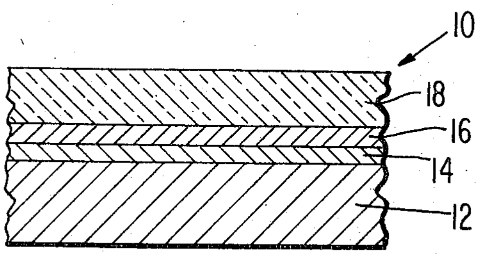
FIG. 2 is a sectional view showing one form of a semiconductor device being made by the method of the present invention.

Referring initially to FIG. 2, there is shown one form of a semiconductor device generally designated as 10, being made by the method of the present invention. The device shown comprises a flat substrate 12 of single crystalline silicon of either P type or N type conductivity. The substrate 12 can be relatively thick, in the order of 75 microns, so as to be rigid. If the substrate 12 is of boron doped P type, it should have a carrier concentration of no greater than $5\times10^{19}$ cm.$^{-3}$. If the substrate 12 is of N type it can contain any desired dopant concentration. The substrate 12 also has its surfaces oriented on a <100> crystellographic plane. On a surface of the substrate 12 is a barrier layer 14 of P type conductivity single crystalline silicon. The barrier layer 14 is doped with boron and has a carrier concentration of greater than $5\times10^{19}$ cm.$^{-3}$ and preferably at least $1\times10^{20}$ cm.$^{-3}$. Also, the barrier layer 14 is preferably very thin, in the order of five microns.

On the barrier layer 14 is a region 16 of a single crystalline silicon which forms the active portion of the semiconductor devices being made. Therefore, the region 16 is of a conductivity type or types and is of a thickness required for the particular semiconductor devices being made. For example, to form diodes, the region 16 would be superimposed contiguous layers of opposite conductivity type having a PN junction therebetween. To form a type of a transferred electron effect device, the region 16 may be a layer of P type conductivity sandwiched between two layers of N+ type conductivity. To form integrated circuits, the region 16 may be of either conductivity type into which will be formed active regions of the various components of the circuit to be formed. To make high frequency semiconductor devices, the region 16 is preferably relatively thin, in the order of about 10 microns. On the region 16 is a support body 18 of an electrical insulating or semi-insulating material, such as glass, quartz or a high resistance semiconductor material.

Figure 1:
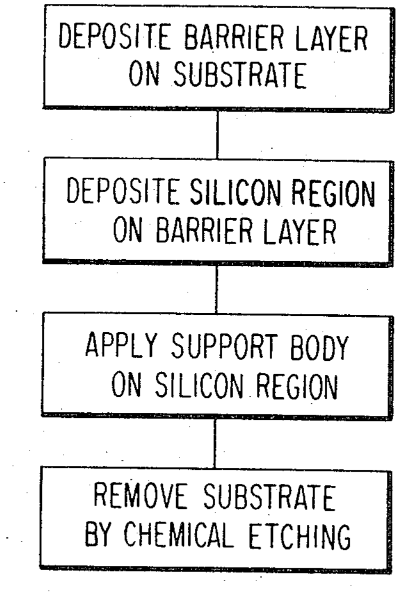
FIG. 1 is a flow chart of the method of the present invention.

As indicated in the flow chart of FIG. 1, the device 10 shown in FIG. 2 can be formed by first depositing on the surface of the substrate 12 an epitaxial layer of the highly boron doped silicon to form the barrier layer 14. The barrier layer 14 may be deposited by any well known epitaxial deposition technique. For example, the substrate 12 can be placed in a chamber through which is provided a flow of a gas containing silicon and boron, such as a mixture of silane and diborane. The chamber is heated to a temperature, approximately 1000° C., at which the gas reacts to form silicon and boron which deposit on the substrate as the barrier layer 14. The silicon region 16 can then be epitaxially deposited on the barrier layer 14 in a manner similar to that for depositing the barrier layer. However, the number and composition of the epitaxial layers which form the region 16 depend on the semiconductor device being formed. To form a diode, two layers of opposite conductivity type may be deposited in sequence, or a single layer of one conductivity type may be epitaxially deposited on the barrier layer 12 and a conductivity modifier of the opposite conductivity type diffused into the single layer. To form a device in which only the concentration of the conductivity modifier varies, a single layer of the desired conductivity may be deposited with the ratio of the conductivity modifier containing gas in the deposition gas being varied during the deposition process. The support body 18 is then applied to the silicon region 16. If the support body 18 is glass or quartz it can be fusion bonded directly to the silicon region. A semi-insulating semiconductor material support body can be epitaxially deposited on the bottom region 16 in the manner described above.

Figure 4:
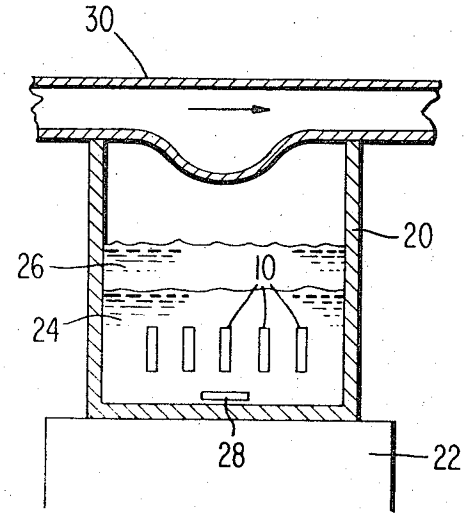
FIG. 4 is a schematic view of an apparatus used to carry out one operation of the method of the present invention.

The substrate 12 is then completely removed. This is achieved by chemically etching the substrate 12 in a heated, concentrated solution of potassium hydroxide covered with a layer of 1-propanol. FIG. 4 shows an apparatus which can be used to carry out the etching away of the substrate 12. The apparatus comprises a container 20 seated on a stirrer hot plate 22. The concentrated potassium hydroxide 24 is within the container 20 and is covered by a layer 26 of the 1-propanol. A magnetic stirrer 28 is within the potassium hydroxide solution, and a water jacket 30 fits over the top of the container 20. The devices 10 are placed in the potassium hydroxide solution 24 which is stirred by the stirrer 26 and heated to a temperature of about 85° C. A plurality of the devices 10 can be supported in the potassium hydroxide solution in a suitable holder, not shown. Each of the devices 10 may be coated with a suitable resist material around its periphery and over the surface of the support body 18 so that only the surface of the substrate 12 is exposed to the potassium hydroxide.

In the etching of the substrate 12, it is known that the heated potassium hydroxide 1-propanol solution etches <100> oriented silicon at a relatively fast rate, approximately 1 micron per minute. However, we have discovered that when the concentration of the P type conductivity modifier, boron, in the silicon is made greater than $5\times10^{19}$ cm.$^{-3}$ and preferably greater than $1\times10^{20}$ cm.$^{-3}$ the etching rate slows down radically, by a factor greater than 100. For example, using an etching solution of 300 milliliters of water, 90 grams of potassium hydroxide and 200 milliliters of 1-propanol results in the following etch rates:

| Conductivity type | Doping concentration (cm.$^{-3}$) | Etch rate (microns/min.) |
|---|---|---|
| P+ (boron) | Approximately $1\times10^{20}$ | 0.0106 |
| P− (boron) | $1\times10^{16}$–$1\times10^{17}$ | 1.1 |
| N− (phosphorus) | Approximately $10^{24}$ | 1.27 |
| N+ (antimony) | 2-5$\times10^{19}$ | 1.31 |

Thus, it can be seen that the etch rate for the highly doped boron (P+) silicon is over 100 times slower than for either the lower doped boron (P−) or the N type silicon. Also, it has been found that the potassium hydroxide 1-propanol etching solution has the advantages over other potassium hydroxide alcohol etching solutions of a faster etch rate for the lower doped boron silicon and the N type silicon and a slower etch rate for the highly doped boron silicon so as to have a greater etch rate differential. For example, using an etching solution of 300 milliliters of water, 90 grams of potassium hydroxide and 200 milliliters of iso-propyl alcohol results in the following etch rates:

| Conductivity type | Doping concentration (cm.$^{-3}$) | Etch rate (microns/min.) |
|---|---|---|
| P+ (boron) | Approximately $1\times10^{20}$ | 0.017 |
| P− (boron) | $1\times10^{16}$–$1\times10^{17}$ | 0.44 |
| N+ (antimony) | 2-5$\times10^{19}$ | 0.58 |

By comparing the above two tables it can be seen that the potassium hydroxide 1-propanol etch solution etches the lower boron doped silicon and the N type silicon about twice as fast as the potassium hydroxide iso-propyl alcohol etching solution but etches the highly boron doped silicon only about one-half as fast.

Thus, by having the barrier layer 14 between the substrate 12 and the active region 16, the substrate 12 will be etched away relatively fast but the etching will substantially stop when all of the substrate 12 is removed and the barrier layer 14 is reached. Also, when the substrate 12 is completely removed, the barrier layer 14 is left with a smooth, flat surface. In addition, while the substrate 12 is being etched away gas bubbles are formed in the potassium hydroxide solution and these bubbles stop when the substrate 12 is completely removed. Thus, there is provided a visible indication as to when the substrate 12 is completely removed and the devices 10 can be removed from the etchant. In this etching system the 1-propanol layer 26 serves the dual purpose of keeping the temperature of and the 1-propanol concentration in the potassium hydroxide solution 24 constant.

After the substrate 12 is removed, the device 10 comprises the support body 18 having the active silicon region 16 on a surface thereof and the barrier layer 14 over the active region 16. Since the barrier layer 14 contains a high concentration of the conductivity modifier and is therefore of very low resistance, it can be used as a low resistance contact for the active region 16 if the semiconductor devices being made so permits. For example, if diodes were being made and the active region 16 had the P type layer adjacent the barrier layer 14, the barrier layer could serve as a low resistance contact to the P type layer. However, if the barrier layer 14 is not desired, it can be easily removed by etching in a nitric and hydrofluoric acid mixture. Since the barrier layer 14 is very thin it can be etched away quickly leaving the active region 16 with a flat, smooth surface. The device 10 can then be processed to complete the semiconductor device being made. For example, metal contacts can be applied, to form an integrated circuit the active region 16 may be provided with areas of different conductivity types by diffusion or ion implantation to form the desired circuit, and the device may be diced into individual semiconductor devices.

Figure 3:
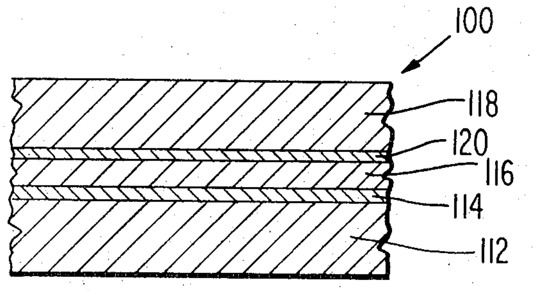
FIG. 3 is a sectional view showing another form of a semiconductor device being made by the method of the present invention.

Referring to FIG. 3, another form of a semiconductor device being made by the method of the present invention is generally designated as 100. The semiconductor device 100, like the semiconductor device 10 shown in FIG. 2, comprises a substrate 112 of single crystalline silicon, a thin barrier layer 114 of a highly doped P type conductivity single crystalline silicon on a surface of the substrate 112, an active region 116 of single crystalline silicon on the barrier layer 114, and a support body 118 on the active region 116. However, the support body 118 is of an electrically conductive metal, such as copper, which is bonded to a thin metal film 120 coated on the surface of the active region 116. The metal support body 118 can serve as a heat sink and/or as an electrode for the semiconductor devices being made. The device 100 is made in the same manner as previously described with regard to the device 10 shown in FIG. 2. However, after the active region 116 is deposited on the barrier layer 114, the metal film 120 is coated on the surface of the active region 116 by any well known technique, such as by vacuum evaporation. The metal support body 118 is then applied to the metal film 120. This can be achieved either by bonding a metal body to the metal film, such as by thermocompression bonding or by soldering, or the metal body can be electroplated onto the metal film. The substrate 112 is then removed by the chemical etching process previously described.

Thus, there is provided by the present invention a method of making a semiconductor device which has a thin active region of single crystalline silicon on a support body. By forming the active region of the device as an epitaxial layer on a substrate, thin active regions of uniform thickness and good quality semiconductor material can be obtained without danger of breaking the thin region. By providing the thin highly doped P type barrier layer between the active region and the substrate, the substrate can be easily removed by a chemical etching procedure which completely removes the substrate without adversely affecting the active region and leaves a smooth flat surface. Also, the etching procedure is suitable for mass production since it can be carried out on a plurality of the devices simultaneously and provides a visual indication of when the etching of the substrate is completed. In addition, since the barrier layer is of low resistance it can be utilized as a contact for certain types of semiconductor devices which can be formed by the method of the present invention. However, where the barrier layer cannot be so used, it can be easily and quickly removed.

We claim:

1. A method of making a semiconductor device comprising the steps of:

(a) forming on a surface of a substrate of single crystalline silicon a thin barrier layer of single crystalline P type conductivity silicon with the free carrier concentration being greater than $5\times10^{19}$ cm.$^{-3}$, (b) forming on said barrier layer a region of single crystalline silicon, said region being of a conductivity type or types required by the semiconductor device being formed, and (c) removing said substrate by etching with a solution of potassium hydroxide and 1-propanol.

2. The method in accordance with claim 1 in which the substrate is either P type conductivity with a free carrier concentration of not greater than $5\times10^{19}$ cm.$^{-3}$ or N type conductivity.

3. The method in accordance with claim 2 including providing a support body on the region prior to removing the substrate.

4. The method in accordance with claim 3 in which the support body is of an electrical insulating material and is bonded to the surface of the region.

5. The method in accordance with claim 3 in which the support body is of an electrically conductive metal.

6. The method in accordance with claim 5 in which a metal film is coated on the surface of the region and the support body is provided on the metal film.

7. The method in accordance with claim 6 in which the metal body is bonded to the metal film.

8. The method in accordance with claim 6 in which the metal body is plated onto the metal film.

9. The method in accordance with claim 1 in which after the substrate is etched away the barrier layer is removed.

References Cited

UNITED STATES PATENTS

| | | | |
|---|---|---|---|
| 3,721,588 | 3/1973 | Hays | 156—17 X |
| 3,725,160 | 4/1973 | Bean et al. | 156—17 |
| 3,689,993 | 9/1972 | Tolar | 156—17 UX |

WILLIAM A. POWELL, Primary Examiner

U.S. Cl. X.R.

156—7; 252—79.5